United States Patent
Moslehi et al.

(10) Patent No.: US 6,444,103 B1
(45) Date of Patent: Sep. 3, 2002

(54) METHOD AND APPARATUS FOR THIN FILM DEPOSITION USING AN ACTIVE SHUTTER

(75) Inventors: Mehrdad M. Moslehi, Los Altos; Yong Jin Lee, Palo Alto, both of CA (US); Cecil J. Davis, Greenville, TX (US); Ajit P. Paranjpe, Sunnyvale, CA (US)

(73) Assignee: CVC Products, Inc., Rochester, NY (US)

( * ) Notice: Subject to any disclaimer, the term of this patent is extended or adjusted under 35 U.S.C. 154(b) by 7 days.

(21) Appl. No.: 09/662,575

(22) Filed: Sep. 15, 2000

(51) Int. Cl.[7] ............... C23C 14/34; C23C 16/00; B05C 11/11
(52) U.S. Cl. ............... 204/298.11; 204/298.06; 204/298.12; 204/298.23; 118/723 E; 118/729; 118/504
(58) Field of Search ............ 204/298.06, 298.11, 204/298.12, 298.23; 118/723 E, 729, 504

(56) References Cited

U.S. PATENT DOCUMENTS 3,640,812 A * 2/1972 Vossen, Jr. et al. ......... 204/192
3,784,458 A * 1/1974 Lane ..................... 204/192
5,178,739 A * 1/1993 Barnes et al. .......... 204/192.12
5,382,339 A * 1/1995 Aranovich ............. 204/192.12
6,051,113 A * 4/2000 Moslehi ................. 204/192.12

* cited by examiner

Primary Examiner—Steven H. VerSteeg
(74) Attorney, Agent, or Firm—Baker Botts L.L.P.

(57) ABSTRACT

Material is deposited from an active shutter onto a substrate located in a processing chamber housing with a shutter target coupled to a shutter target assembly. A first target assembly located in the housing supports a target for physical-vapor deposition of a first material onto the substrate. A shutter is selectively moveable to extend into a closed or activated position and to retract into an open position. The shutter target assembly is coupled to the shutter such that when the shutter is in the closed position, the shutter target assembly is positioned to allow deposition of material from the shutter target onto the substrate. When the shutter is in the open position, the first target is positioned to deposit material onto the substrate. Alternating layers of materials may be deposited by the shutter target and first target by cycling the shutter between an open position and a closed position.

15 Claims, 2 Drawing Sheets

METHOD AND APPARATUS FOR THIN FILM DEPOSITION USING AN ACTIVE SHUTTER

TECHNICAL FIELD OF THE INVENTION

This invention relates in general to the field of microelectronic device fabrication, and more particularly to a method and apparatus for thin film deposition using an active shutter in a physical-vapor deposition system.

BACKGROUND OF THE INVENTION

Shutters perform specialized functions in thin film processing, particularly in physical-vapor deposition (PVD) systems, by regulating a division of space within a processing chamber. Typically a first region of the divisible space includes a substrate support for supporting the substrate and in some applications, regulating the temperature of the substrate to be processed. A second region of the divisible space includes a process energy source such as a physical-vapor deposition ("PVD") target electrode. Shutter activation temporarily divides a thin-film processing chamber into two separate regions of space by insertion of the shutter into the processing chamber between the substrate support and the target. Thus, a shutter blocks the line-of-sight view between the target and the substrate.

Shutters support a number of device processing functions including the plasma cleaning of substrates, the surface preparation of targets such as by target burn-in, or timing operations, such as end-pointing or terminating a deposition process involving plasma sputtering effects between the target and substrate. For example, to clean a substrate the shutter is grounded and bias voltage such as an RF bias is applied to the substrate. Similarly, to clean a target a bias voltage such as DC or RF bias is applied to the target. A shutter can help with the substrate and target cleaning operations by preventing cross-contamination between the target and the substrate during these operations. A shutter also helps to reduce process transients by stabilizing PVD plasma generated through target bias with the shutter closed and then opening the shutter to expose the substrate to the target and the sputtering flux initiated from the target.

Typical shutters have an extendible arm assembly that acts to move the shutter, usually a blocking plate, between an open position in which the substrate support is exposed to the target and a closed position in which the shutter intercedes between the substrate support and the target. For instance, an actuator may extend the shutter plate across the processing chamber, with the shutter moving in a plane parallel to the target and the substrate from one side of the process chamber so as to establish a closed position dividing the chamber space. Retraction of the shutter plate from the chamber into a shutter housing attached to the process chamber establishes an open position.

Use of a shutter improves thin film processing in a single chamber but does not address other difficulties associated with deposition of plural thin film layers of different materials. A single target electrode in a PVD processing chamber allows deposition of only the target's material on the substrate surface within that chamber. Thus, generally thin film processing requiring the sputter deposition of multiple layers of distinct materials onto a substrate involves processing in multiple chambers or vacuum chambers, comprising multiple process stations. Multi-chamber processing tends to increase processing costs with additional processing equipment such as additional chambers, wafer handling equipment for transferring a substrate from one chamber to the next, and extended processing time due to extra wafer handling steps. Also, the movement of a substrate from one chamber to the next often introduces impurities either due to the residual contaminants in the substrate handling hub or particles. For instance, freshly deposited material or particles may break off the edges of the substrate or the transfer equipment during substrate transfer and handling.

One potential solution to the problems related to the deposition of multiple thin film layers is to provide multiple target electrodes in a single vacuum processing chamber. However, single vacuum processing chambers with multiple target electrodes or multiple PVD stations may result in cross-contamination of targets and substrates by the material of the different targets, thereby affecting process reliability and repeatability.

Contamination within the surface of the chamber is another common problem associated with the use of multiple targets in a single deposition chamber. After a number of deposition runs, the deposition chamber often contains impurities that dislodge as particles to disrupt the deposition process. To address this difficulty, the deposition chamber is or the deposition shield typically serviced to remove impurities from the system. Such servicing or shield replacements would have to occur more often if multiple materials are used in a chamber. Frequent servicing disrupts processing flow due to the need for vacuum breaks, consuming valuable time and resources.

SUMMARY OF THE INVENTION

Therefore a need has arisen for a method and apparatus for thin film deposition of plural material layers on a substrate which deposits different materials in a single processing chamber.

A further need exists for a method and apparatus for thin film deposition of plural material layers on a substrate which supports deposition of plural materials in a single processing chamber while reducing the maintenance required to manage contaminants at or below a desired level.

A further needs exists for a method and apparatus for thin film deposition of plural material layers on a substrate which increases throughput and-decreases equipment cost, footprint and processing time.

In accordance with the present invention, a method and apparatus for thin film deposition using an active shutter is provided that substantially eliminates or reduces disadvantages and problems associated with previously developed thin film deposition equipment. A shutter target support couples to a shutter so that a target in the shutter target support moves into and out of the processing chamber in conjunction with the shutter. When the shutter is in a closed position, a target in the shutter target support is positioned facing the substrate for deposition of a material on a substrate. When the shutter is in an open position, the shutter target support is substantially removed from the processing chamber to allow deposition of another material on the substrate from a main target located in the processing chamber.

More specifically, in one embodiment a vacuum processing chamber housing has a main target support located in it that supports a target electrode comprised of a first material for deposition on a substrate. The vacuum processing chamber housing also has a substrate support that is generally opposed to the first target support with a direct line-of-sight view so that material of the first target deposits onto a substrate in the substrate support.

A shutter interfaces with the housing through a slot that allows movement of the shutter between a closed position and an open position. When the shutter is positioned in the closed position, the shutter enters through the slot to create a barrier or blockage between the first or main target support and the substrate support. When the shutter is positioned in the open position, the shutter exits the housing through the slot to allow material deposition from the first target onto the substrate.

A shutter target support is coupled to the shutter assembly such that when the shutter is in the closed position, a shutter target associated with the shutter target support substantially aligns with and faces the substrate support. The shutter target associated with shutter target support is comprised of a second PVD target material for deposition on the substrate. In one embodiment, the shutter target support retrofits a conventional shutter to enable conversion of the conventional shutter to support deposition of a second type of material in a single PVD vacuum processing chamber.

The shutter cooperates with the housing to create different regions of space dependent upon the shutter's position. With the shutter in the open position, the housing defines a region of process space that allows deposition from a main target in the housing, for instance coupled to the top of the housing, onto a substrate. With the shutter in the closed position, the shutter in cooperation with the housing, defines a region of space that allows deposition from a shutter target, coupled to the shutter, onto a substrate, while blocking the main target.

In operation, the present invention deposits thin film layers of plural types of material onto a substrate. For instance, a first thin film layer of material is deposited from a first target or main target located in the processing chamber when the shutter is in an open position. Once the first material is deposited, the shutter moves to a closed position, bringing the shutter target into substantial alignment with the substrate. A second material is then deposited from the shutter target onto the substrate. Deposition of the first and second materials essentially occur in separate regions of space without any cross-contamination between the two targets to reduce the risk of contamination of the substrate. Each target's process space is established by positioning of the shutter in either an open or closed position with the position open for deposition from the main target and closed for deposition from the shutter target.

The present invention provides a number of important technical advantages. One important technical advantage is the deposition in a single vacuum processing chamber of plural types of materials as thin film layers on a substrate. The association of a target with an active shutter allows deposition of multiple materials with minimal modification to existing single-target equipment. The shutter target support easily couples to conventional PVD shutters, allowing retrofitting of existing single target PVD systems to enable multiple target operation without substantial expense or design changes.

Another important technical advantage of the present invention is the capability of depositing plural materials in a single PVD processing chamber with reduced risk of contamination of the substrate due to cross-contamination between the targets during processing. For instance, the shutter isolates the shutter target during deposition from target(s) located in the processing chamber by retracting the shutter target from the processing chamber away from the main process chamber and into the shutter housing when the shutter is in the open position. Similarly, the shutter isolates targets located in the processing chamber during deposition from the shutter target by inserting the shutter plate between the substrate and the processing chamber targets. The effective isolation of processing chamber target(s) from shutter target(s) minimizes risk of cross-contamination during processing, and reduces maintenance requirements to manage contaminant levels.

Another important technical advantage of the present invention is that it provides increased efficiency and throughput in deposition processes. For instance, deposition of plural materials in a single chamber increases process throughput by eliminating the time generally needed to transfer a substrate among multiple processing chambers. Processing cost is also reduced due to the decreased cost of ownership (COD) for the PVD processing equipment. The use of a single process chamber also reduces the contaminants for multi-layer film processing and reduces equipment footprint.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Figure 1:
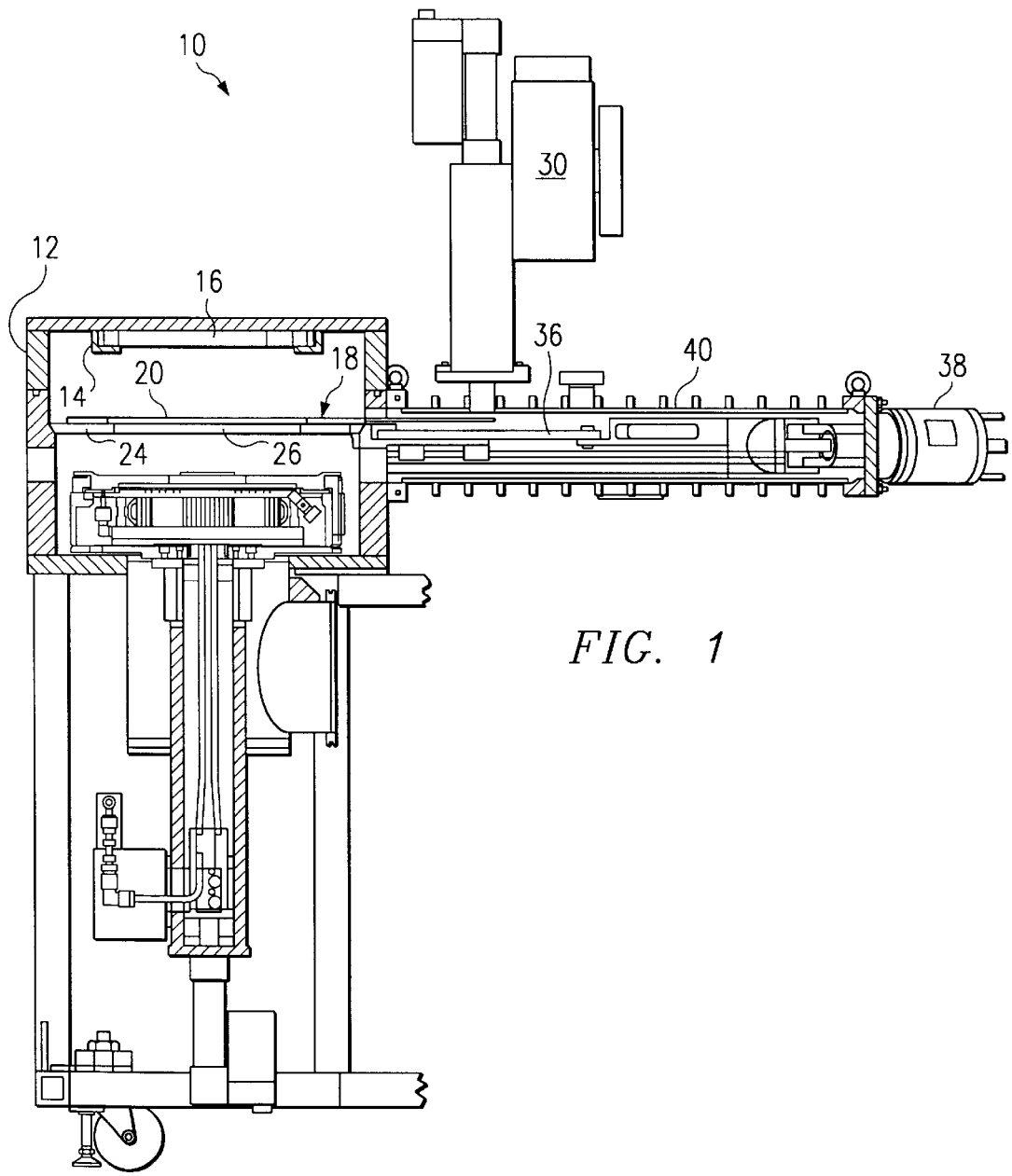
FIG. 1 is a side view of a physical-vapor deposition processing chamber and associated active shutter for depositing plural materials onto a substrate.
Figure 2:
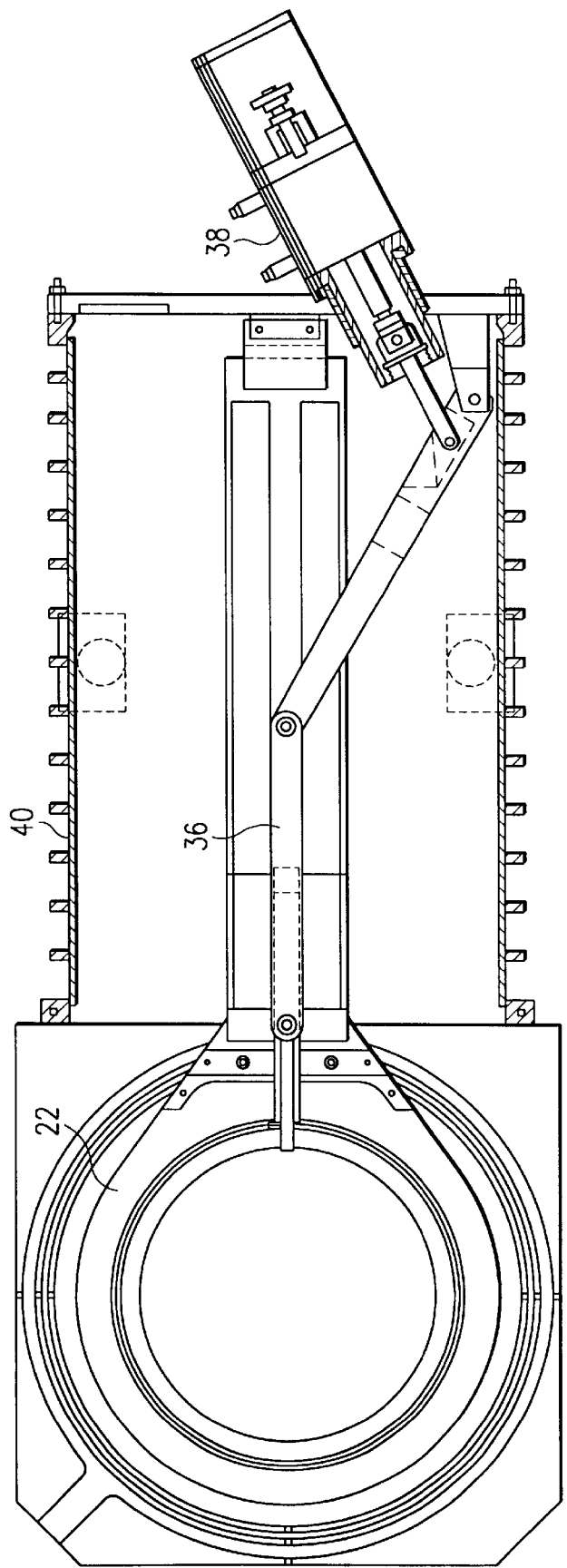
FIG. 2 is a top view of an active shutter apparatus for depositing material in a physical-vapor deposition system.

Preferred embodiments and their advantages are best understood by reference to FIGS. 1 and 2, wherein like numbers are used to indicate like and corresponding parts.

FIG. 1 depicts a side schematic diagram view of one embodiment of a physical-vapor deposition (PVD) apparatus for depositing plural thin film layers of different types of materials on a substrate. The apparatus indicated generally at 10 includes a housing 12 and a first target assembly 14 disposed at the top end of housing 12. First target assembly 14 secures a first target electrode 16 onto housing 12. A substrate support 18 is disposed in housing 12 distal from and opposed to first target assembly 14 such that substrate support 18 faces first target assembly 14. Substrate support 18 supports a substrate 20 in substantial alignment with first target 16 so that material from target 16 may be deposited on substrate 20 using conventional deposition methods such as physical vapor deposition (PVD). Substrate support 18 moves relative to target assembly 14 to allow adjustment of the distance between target 16 and substrate 20 during or prior to deposition cycle. Although housing 12 supports physical-vapor deposition, in alternative embodiments, housing 12 may support any deposition technique in which a shutter affects deposition from a source to a substrate.

A shutter housing 40 is coupled to a slot or opening or access port of housing 12 so that a shutter 22 residing in shutter housing 40 is extendible into housing 12 through the slot. Shutter 22 is connected to an actuator 38 by an arm assembly 36. Actuator 38 operates arm assembly 36 such that shutter 22 is selectively and controllably moveable between an open position, in which substrate 20 is exposed to target 16, and a closed position, in which shutter 22 extends into housing 12 to intercede between substrate 20 and target 16. When shutter 22 is in the closed position, shutter 22 creates a barrier between first target 16 and substrate 18 that effectively eliminates the deposition of material from first target 16 onto substrate 20.

A shutter target assembly 24 is coupled to shutter 22 such that shutter target assembly 24 may hold a shutter target 26 (thus, the name active shutter) at the bottom side of shutter 22. Shutter target assembly 24 is coupled to shutter 22 in a conventional manner so that, when the shutter is actuated to the closed position, shutter target 26 substantially aligns with substrate 20 to allow deposition of material from shutter target 26 onto substrate 20 by conventional deposition methods such as PVD. In one embodiment, shutter target support 24 may be coupled to conventional shutters as a retrofit that converts an existing single-target system into a multi-target (e.g., two-target) system. Shutter target assembly 24 holds a shutter target 26 having a substantially circular shape, other shapes such as rectangular shape, may also be used. In an alternative embodiment, shutter target assembly 24 may hold targets having other conventional, noncircular geometries.

A power supply 30, such as an RF or DC power supply for PVD, provides power for deposition from each of targets 16 and 26 onto substrate 20. In alternative embodiments, plural power supplies may cooperate with the targets 16 and 26 as needed to deposit materials on substrate 20.

During conventional PVD, substrate support 18 is typically grounded or may be electrically biased and substrate 20 is typically cooled by a cooling system. Alternatively, substrate support 18 may be associated with a heating element selectively heats substrate support 18 and substrate 20. Substrate support 18 cooperates with conventional substrate transfer equipment, such as a cluster tool central wafer handler, to transfer substrate 20 into and out of housing 12.

Shutter 22 has a generally flat surface and an outer circumference that has a substantially circular geometry so that, when in the closed position, the outer circumference of shutter 22 substantially conforms to the side walls of housing 12 to form separate regions of process chamber space. In alternative embodiments, shutter 22 may have a noncircular geometries, such as rectangular or hexagonal geometries, corresponding to the geometry of the housing and/or the substrate. Actuator 38 is powered hydraulically, electrically, by compressed air or by other conventional means. Actuator 38 is coupled to shutter 22 with arm assembly 36 so that actuation causes arm assembly 36 to push shutter 22 into a closed position or causes arm assembly 36 to retract shutter 22 into an open position. Rapid actuation of shutter 22 creates alternating regions of space in housing 12 relative to substrate support 18 and either target 16 or target 26.

In operation, substrate 20 is secured to substrate support 18, first target 16 is secured to first target assembly 14 and shutter target 26 is secured to shutter target assembly 24. First target 16 and shutter target 26 are comprised of predetermined distinct material types such that material from target 16 and material from shutter target 26 may be alternatively deposited on substrate 20 in order to fabricate the desired material stack.

As an example of deposition of thin film layers, processing begins with shutter 22 in a closed position, creating a barrier between substrate 20 and first target 16. Power is then supplied to first target 16 from power supply 30 such that first target 16 obtains a steady state of deposition on the upper surface of shutter 22. Shutter 22 is then retracted into shutter housing 40 and material from first target 16 is deposited on substrate 20. When a predetermined thickness is deposited, shutter 22 is returned to the closed position to discontinue deposition from first target 16 to substrate 20. After shutter 22 has returned to the closed position, power is discontinued to first target 16 to cease deposition of material. Power is then provided to shutter target 26 such that shutter target 26 deposits material onto substrate 20. Deposition from shutter target 26 continues until a predetermined thickness is achieved. The layer of material deposited from shutter target 26 may have a substantially thinner thickness, such as a laminate layer, or otherwise be related to deposition properties associated with shutter target 26 or the deposition conditions provided by shutter target 26.

Power to targets 16 and 26 is cycled with the position of shutter 22 to result in the desired deposition layers. Actuator 38 activates shutter 22 to retract or extend shutter 22 into an open position or closed position as appropriate to allow deposition of material from either target 16 or 26 to be deposited onto substrate 20. In one embodiment, power to shutter target 26 may be continued during activation until shutter 22 retracts into the closed position at which time power to shutter target 26 is discontinued. The operation of shutter 22, shutter target 26, and first target 16 facilitate multi-layer deposition processing within a single processing chamber. The steps of alternating deposition from first target 16 and shutter target 26 may be repeated to form multiple layers onto substrate 20.

In one embodiment, shutter target 26 may be comprised of material such as aluminum or another suitable material for suspending or trapping contaminants or impurities and particles within housing 12. When no substrate 20 is secured by substrate support 18, shutter 22 is positioned in the closed position and power is introduced to shutter target 26. Shutter target electrode 26 deposits material (e.g., aluminum) into the interior of housing 12 including the process chamber shields in the direction in which second target electrode 26 faces. The deposition of material from second target 26 acts to suspend or trap impurities, particles and contaminants within housing 12.

FIG. 2 is a schematic of an overhead view of a shutter assembly. The shutter assembly comprises shutter housing 40 that houses shutter 22, arm assembly 36 and actuator 38. Actuator 38 is rotationally coupled to shutter 22 by arm assembly 36 such that, as the actuator arm advances, a portion of arm assembly 36 rotates causing another member of arm assembly 36 to advance shutter 22 into the closed position or retracts into the open position.

Although the disclosed embodiments have been described in detail, it should be understood that various changes, substitutions and alterations can be made to the embodiments without departing from their spirit and scope.

What is claimed is:

1. An apparatus for depositing material onto a substrate comprising:

a housing;

a substrate support disposed in the housing, the substrate support operable to support the substrate;

a first target assembly disposed in the housing, the first target assembly operable to support a first deposition target positioned to deposit a first material on the substrate;

a shutter selectively movable between a closed position wherein the shutter is inserted into the housing and an open position wherein the shutter is withdrawn from the housing; and a second target assembly coupled to the shutter, the second target assembly operable to support a second deposition target positioned to deposit a second material when the shutter is in the closed position.

2. The apparatus of claim 1 further comprising:

a first target coupled to the first target assembly; and a second target coupled to the second target assembly.

3. The apparatus of claim 2 wherein the first target is comprised of a first material and the second target is comprised of a second material that is distinct from the first material.

4. The apparatus of claim 3 wherein:

the second target comprises a material for deposition as a substantially thinner laminate layer relative to the material deposited from the first target.

5. The apparatus of claim 2 wherein the second target comprises a second material wherein deposition of the second material within the housing traps contaminates within the housing to aid with clean substrate processing.

6. The apparatus of claim 2 further comprising at least one power source for performing physical-vapor deposition, the power source interfaced with at least one of the first and second targets.

7. The apparatus of claim 6 wherein the power source comprises a radio-frequency power source.

8. The apparatus of claim 6 wherein the power source comprises a direct-current (DC) power source.

9. The apparatus of claim 6 further comprising:

plural power sources operable to selectively regulate the power delivered to the first and second targets.

10. The apparatus of claim 9 wherein the substrate support selectively positions the substrate at predetermined adjustable distances from the first and second targets.

11. A shutter target apparatus comprising:

a shutter target assembly adapted to couple to a shutter assembly, the shutter assembly operable for insertion into a physical vapor deposition housing to impede physical vapor deposition from a target in the housing to a substrate and operable for removal from the physical deposition housing to permit deposition from the target to the substrate, the shutter target assembly operable to support a second physical-vapor deposition target for physical vapor deposition when the shutter assembly is inserted in the housing.

12. The apparatus of claim 11 further comprising a target coupled to the shutter target assembly.

13. The apparatus of claim 12 wherein the target is comprised of a material for thin film physical-vapor deposition.

14. The apparatus of claim 12 further interfaced with a power source for supporting physical vapor deposition.

15. The apparatus of claim 11 wherein the shutter target assembly retrofits an installed shutter for physical-vapor deposition from the shutter onto a substrate.

\* \* \* \* \*